United States Patent [19]

McCullough

[11] Patent Number: 4,594,490
[45] Date of Patent: Jun. 10, 1986

[54] TERMINAL PIN SHORTING SWITCH APPARATUS

[75] Inventor: Harold E. McCullough, Blacklick, Ohio

[73] Assignee: AT&T Bell Laboratories, Murray Hill, N.J.

[21] Appl. No.: 669,661

[22] Filed: Nov. 8, 1984

[51] Int. Cl.[4] .............................................. H01H 1/32
[52] U.S. Cl. ................................. 200/248; 200/51.09; 200/335
[58] Field of Search ................. 200/51.1, 51.11, 51.12, 200/51.09, 276, 283, 335, 248

[56] References Cited

U.S. PATENT DOCUMENTS

| | | | |
|---|---|---|---|
| 1,765,569 | 6/1930 | Corbett | 200/283 |
| 2,785,239 | 3/1957 | Zellner | 200/283 |
| 2,909,615 | 10/1959 | Frantz | 179/96 |
| 3,512,043 | 5/1970 | Jaaksoo et al. | 200/51.1 X |
| 3,571,780 | 3/1971 | Boenning et al. | 339/36 |
| 3,950,059 | 4/1976 | Anhalt et al. | 339/75 |
| 4,053,724 | 10/1977 | Liona | 200/51 |
| 4,070,557 | 1/1978 | Ostapovitch | 200/51.1 |
| 4,103,125 | 7/1978 | Marrero | 200/51 |
| 4,377,318 | 3/1983 | Long | 339/75 |
| 4,488,018 | 12/1984 | Hayashida | 200/276 |

FOREIGN PATENT DOCUMENTS 1205780 2/1960 France ............................ 200/51.1

OTHER PUBLICATIONS

"Pin Shorting Contact", A. M. Wittenberg, *Western Electric Technical Digest*, No. 60, Oct. 1980, p. 25.

*Primary Examiner*—Stephen Marcus
*Assistant Examiner*—R. S. Luebke
*Attorney, Agent, or Firm*—Dwight A. Marshall

[57] ABSTRACT

Switch assembly for use with equipment mounting apparatus backplane terminal pins. The assembly comprises an insulating housing member that is placed over a pair of adjacent terminal pins and secured to the backplane. An electrical shorting spring member positioned within the housing member engages both terminal pins to electrically short one terminal pin to another. An actuating member normally in engagement with the electrical shorting member is rotated by a connector inserted onto the backplane terminal pins to disengage the electrical shorting spring member from the pair of terminal pins.

10 Claims, 4 Drawing Figures

TERMINAL PIN SHORTING SWITCH APPARATUS

TECHNICAL FIELD

This invention concerns switch apparatus. In particular, it relates to apparatus arranged for shorting backplane terminal pins of equipment mounting apparatus.

BACKGROUND OF THE INVENTION

Equipment mounting apparatus is widely used in the Electronics and Communication Industry to mount plug-in circuit boards which are interconnected by backplanes of the equipment mounting apparatus to form composite electronic and communication systems. Typically, a backplane has a row and column configuration of terminal pins with each pin having a center section for mounting the pin in a hole of the backplane. One end of a terminal pin may be coupled with interconnecting cables and circuitry of the backplane and the opposite end may be engaged with connectors mounted on plug-in circuit boards. Insertion of circuit boards into the equipment mounting apparatus engages the connectors with the terminal pins to establish electrical connections between the circuit boards and interconnecting cables and backplane circuitry. Oftentimes it is necessary to short together ones of the terminal pins on the backplane when a circuit board is removed to protect apparatus of other circuit boards and to provide a closed loop on lines of electronic and communication systems.

Switch apparatus has been developed for use in shorting backplane terminal pins together. In one arrangement an inverted U-shaped member has one leg affixed to one terminal pin with the other leg normally in contact with another terminal pin. Other switch apparatus has a shroud member which is inserted over a group of terminal pins such that a U-shaped member positioned in a side wall of the shroud has both legs bent over to engage the terminal pins. In operation the edge of an insulating housing of a connector being inserted onto the terminal pins engages the U-shaped members and moves them aside to disengage them from the terminal pins. A problem with these designs is that on multi row and column connectors the switch apparatus can only be used with peripheral terminal pins engaged with the connector and cannot be used with center terminal pins in order to prevent damage to the pins and switch apparatus.

In yet another arrangement, switch apparatus for shorting a pair of terminal pins has a spring member affixed to one terminal pin and is configured and extended therefrom to engage a contact affixed to another terminal pin. Another program arises with this and the aforementioned switch apparatus in that backplane terminal pins are sometimes misaligned and result in the U-members and contacts failing to engage the terminal pins.

The foregoing and other problems are solved and a technical advance is achieved by apparatus arranged to short together and compensate for misaligned terminal pins of equipment mounting apparatus backplanes.

SUMMARY OF THE INVENTION

In the exemplary embodiment of the invention, apparatus for shorting terminal pins comprises a member for receiving ones of the terminal pins. Apparatus positioned in the terminal pin receiving member has a common member interconnecting a pair of independent cantilever spring members each engaging a terminal pin for electrically shorting ones of the terminal pins together and automatically compensating for terminal pin misalignment. An actuating member is positioned in the terminal pin receiving member and has an operating lever rotatably operatable for engaging and disengaging the cantilever spring members with the terminal pins.

In accordance with one feature of the invention, apparatus for shorting together terminal pins comprises spring apparatus formed of electrical conducting material having a pair of helical springs interconnected by a common member. Each helical spring is extended into an independent cantilever spring formed across the other independent cantilever spring to engage one of a pair of terminal pins and compensate for terminal pin misalignment.

In accordance with another feature of the invention, an actuating member for use with switch apparatus shorting terminal pins comprises a pivotal member rotatably positioned in an insulated housing member. A lever member affixed to the pivotal member and positioned in a slot of the housing member to extend outward at an angle from an upper surface thereof has a cam surface positioned between crossed independent cantilever springs electrically coupled together for engaging and disengaging the independent cantilever springs with the terminal pins as the lever member is rotated about an axis of the pivotal member.

Also in accordance with the invention, switch apparatus for shorting terminal pins of equipment mounting apparatus backplanes comprises a housing member having first and second components formed of electrically insulating material assembled together to fabricate the housing member. The first housing component has a chamber with a pair of aperatures opening on the bottom surface thereof for slidably receiving a pair of the terminal pins such that a pair of independent cantilever springs of a spring member positioned in the chamber engages the terminal pins and establishes an electrical shorting path between them. A second housing component has a channel formed parallel to the pair of first housing component apertures and a pair of generally cross-configured slots with one slot formed at a right angle to the channel for receiving a lever affixed to a pivot member positioned in the channel for engaging and disengaging the cantilever springs with the terminal pins. The other slot is formed for slidably receiving the pair of terminal pins that extend vertically from the upper surface thereof.

DESCRIPTION OF THE DRAWING

The foregoing as well as other objects, features and advantages of the invention will be more apparent from a description of the drawing in which.

DESCRIPTION OF THE INVENTION

1. Apparatus

Figure 1:
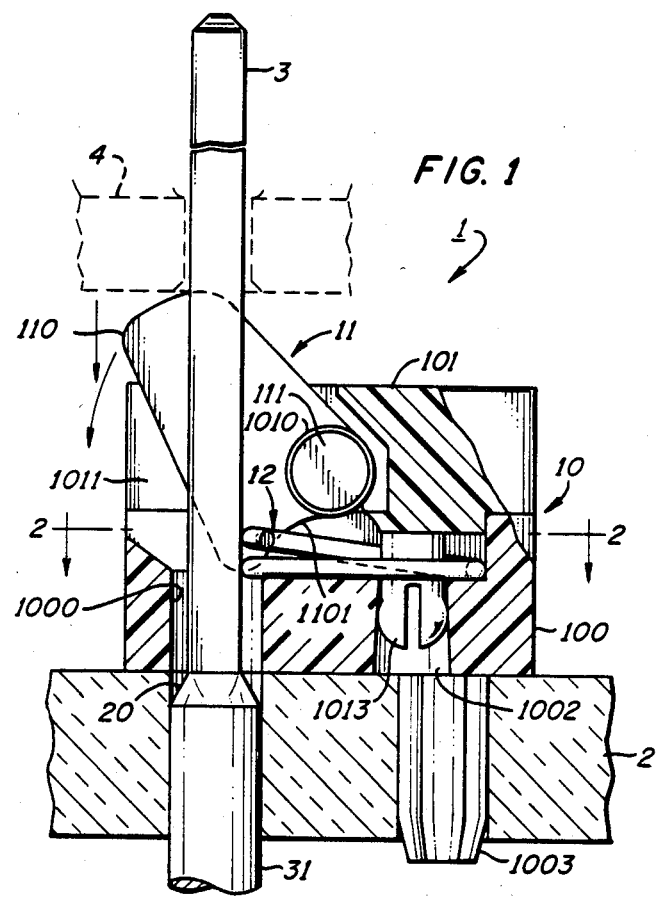
FIG. 1 is a partial sectional side view of apparatus for shorting terminal pins embodying the principles of the instant invention.

Referring to the drawing and more specifically to FIG. 1 of the drawing, switch apparatus 1 set forth therein is intended for use in electrically shorting terminal pins 3 together. In an exemplary embodiment of the invention, terminal pins 3 are mounted in a row and column configuration on an equipment mounting apparatus backplane 2 by inserting compliant section 31 of terminal pin 3 into aperture 20 of backplane 2. Switch apparatus 1 is inserted onto a pair of terminal pins 3 such that electrical shorting member 12 is normally in engagement with each terminal pin 3 and establishes an electrical shorting path between the pair of terminal pins 3. A connector, for example connector 4, intended for use in establishing an electrical connection between connector contacts with backplane terminal pins 3 is inserted onto terminal pins 3 such that the connector housing engages actuating member 11 of switch apparatus 1. Actuating member 11 is rotated about an axis of pivotal member 111 such that cam surface 1101 enables electrical shorting member 12 to disengage from terminal pins 3. When connector 4 is removed from terminal pins 3 actuating member 11 is rotated upward by the force of electrical shorting member 12 against cam surface 1101 thereby enabling electrical shorting member 12 to engage terminal pins 3 and reestablish the electrical shorting path.

Switch apparatus 1 comprises a generally quadrilateral configured housing member 10 formed of an electrical insulating material such as glass filled nylon. Housing member 10 may advantageously comprise separate first housing component 100 and second housing component 101 that may be assembled together to form housing member 10. First housing component 100, FIGS. 2 and 4, has a generally rectangular configured chamber 1001 with a pair of apertures 1000 formed along one edge and extended downward to open through the bottom surface of first housing member 100 to slidably receive terminal pins 3. In addition, the first housing component 100 has another aperture 1002 formed between terminal pin receiving apertures 1000 and contiguous with an opposite edge of chamber 1001. A pair of securing pins 1003 extend vertically downward from the bottom surface of housing component 100 directly opposite terminal pin receiving apertures 1000 and are intended to be inserted into apertures 20 to secure switch apparatus 1 to backplane 2.

Figure 4:
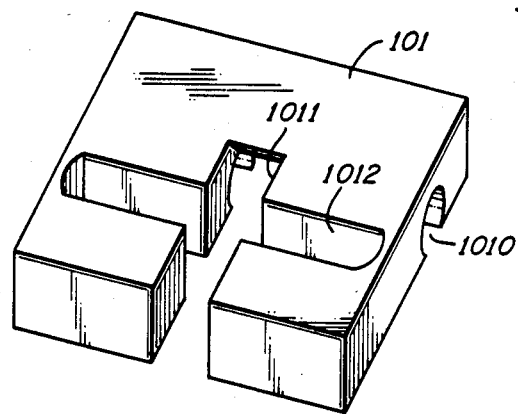
FIG. 4 sets forth a perspective view of the components of the terminal pin shorting apparatus housing member set forth in FIGS. 1 and 2.
Figure 4:
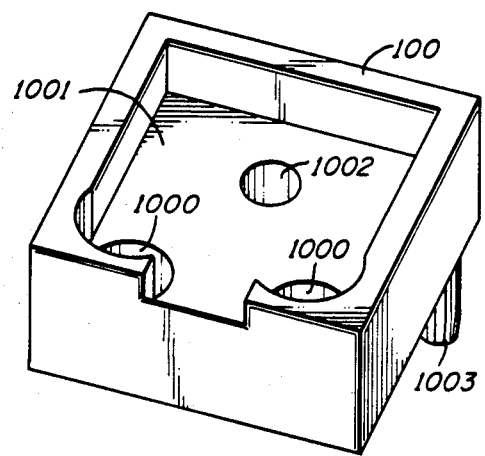

Second housing component 101, FIGS. 1 and 4, has an exterior configuration similar to that of housing component 100. On one surface thereof, intended to be located adjacent to chamber 1001 of housing component 100, a channel 1010 is formed parallel to a line extending through the centers of apertures 1000 of first housing component 100 for the purpose of rotatably supporting actuating member 11. In addition, a pair of generally cross-configured slots 1011, 1012 are formed in second housing component 101 with one slot 1012 formed parallel to channel 1010 and to coincide with apertures 1000 to slidably receive terminal pins 3 which extend through housing member 10. The other slot 1011 located at right angles with slot 1012 and channel 1010 is formed to receive actuating member 11 and enable movement thereof between terminal pins 3 such that switch apparatus 1 may be used not only to short peripheral terminal pins 3 but may be used to short terminal pins 3 located anywhere in a row and column configuration of backplane terminal pins. Second housing component 101, FIG. 1, further comprises a split pin member 1013 extending downward from a bottom surface and is inserted into aperture 1002 of first housing component 100 during assembly to secure second housing component 101 to first housing component 100 and thereby form housing member 10.

Figure 2:
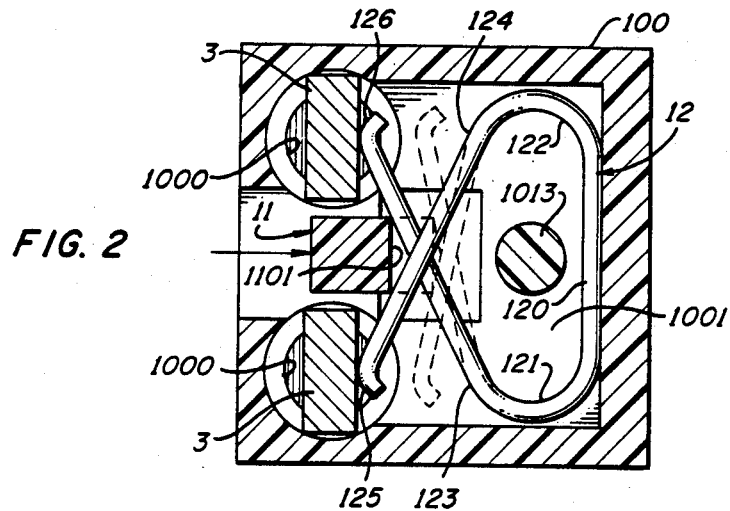
FIG. 2 is a sectional top view of the terminal pin shorting apparatus set forth in FIG. 2 taken along line 2—2.
Figure 3:
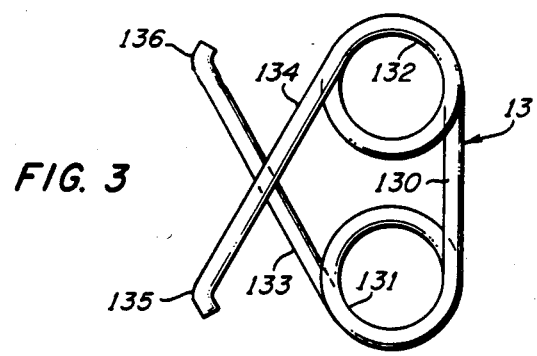
FIG. 3 illustrates another embodiment of the terminal pin electrical shorting and misalignment spring member set forth in FIGS. 1 and 2.

Referring now to FIG. 2 of the drawing, electrical shorting member 12 is formed of an electrical conducting material such as a copper-beryllium alloy and as set forth in one embodiment of the invention, comprises a common member 120 formed at each end into a generally C-configured section 121, 122 extended into a cantilever spring 123, 124 formed across the other cantilever spring. Electrical shorting member 12 is positioned within chamber 1001 of housing component 100 with the tip contact ends 125, 126 of each cantilever spring 123, 124 normally in engagement with a terminal pin 3 thereby establishing an electrical shorting path between a pair of terminal pins 3. In another embodiment of the invention, FIG. 3, electrical shorting member 13 comprises a common member 130 interconnecting a pair of helical springs 131, 132 each extended into an independent cantilever spring 133, 134 formed across the other cantilever spring and having a generally U-shaped tip contact section 135, 136 for engaging a terminal pin 3. Electrical shorting member 13, may as electrical shorting member 12, be positioned in chamber 1001 of first housing component 100 to establish an electrical shorting path between a pair of terminal pins 3. Spring sections 121, 122 and helical springs 131, 132 in combination with their respective independent cantilever springs 123, 124, 133, and 134 maintain engagement with and automatically compensate for misalignment of terminal pins 3.

Actuating member 11, FIGS. 1 and 2 of the drawing, comprises a pivotal member 111 rotatably positioned in channel 1010 of housing component 101. Lever member 110 is mounted on pivotal member 111 and positioned in slot 1011 of housing component 101 to extend outward at an angle from an upper surface of the assembled housing member 10. A cam surface 1101 is formed on actuating member 11 and positioned, FIG. 2, between the crossed independent cantilever springs such that rotation of actuating member 11 moves cam surface 1101 against both independent cantilever springs 123, 124 to disengage tip contact sections 125, 126 from terminal pins 3. Release of lever member 110 enables independent cantilever spring members 123, 124 to exert a force against cam surface 1101 to rotate lever member 110, FIG. 1, upward about pivotal member 111 and thereby enable tip contact surfaces 125, 126 to engage terminal pins 3.

2. Apparatus Assembly

In assembly, FIG. 1, actuating member 11 is positioned in housing component 101 by placing pivot member 111 in channel 1010 with lever member 110 located in slot 1011. Electrical shorting member 12, 13 is positioned in chamber 1001 of housing component 100 with common member 120, 130 located against a back wall of chamber 1001 such that tip contact sections 125, 126, 135, 136 are in engagement with terminal pins 3. Housing component 101 is assembled together with housing component 100 by positioning cam surface 1101 of actuating member 11 at the intersection of independent cantilever springs 123, 124, 133, 134 and inserting split pin member 1013 into aperture 1002 of housing component 100 to form housing member 10.

Lever member 110 is rotated with pivot member 111 to compress cantilever spring members 123, 124, 133, 134 so that switch apparatus 1 may be mounted on equipment mounting apparatus backplane 2 by slidably inserting a pair of terminal pins 3 into apertures 1000 and forcing housing member 10 onto terminal pins 3 such that terminal pins 3 extend through slot 1012 on each side of actuating member 110 when the bottom surface of housing member 10 is abutted against backplane 2. Lever member 110 is released to enable tip contact surfaces 125, 126, 135, 136 to engage terminal pins 3 and thereby electrically short one of the pair of terminal pins 3 with the other.

When connector 4 engages terminal pins 3, lever member 110 is rotated with pivotal member 111 thereby enabling cam surface 1101 to disengage tip contact surfaces 125, 126, 135, 136 from terminal pins 3 which are then available to mate with corresponding terminal apparatus of connector 4. Removing connector 4 from terminal pins 3 enables cantilever springs 12, 13 to rotate lever member 110 to the normal position and engage each terminal pin 3 to reestablish the electrical shorting path between both.

SUMMARY OF THE INVENTION

It is obvious from the foregoing that the facility, economy and efficiency of switch apparatus may be substantially enhanced by switch apparatus arranged to short together backplane terminal pins and automatically compensate for misaligned ones of the pins. It is further obvious from the foregoing that switch apparatus having a common member interconnecting a pair of independent cantilever spring members for engaging a pair of terminal pins and compensating for terminal pins misalignment with an actuating member operatable for engaging and disengaging the cantilever springs from the terminal pins improves switch apparatus for shorting equipment mounting backplane terminal pins.

What is claimed is:

1. Apparatus for shorting terminal pins comprising
means for receiving a pair of the terminal pins,
means positioned in said receiving means and having
  a common member interconnecting a pair of cantilever spring members each integral with said common member and each formed across the other engaging one of said pair of terminal pins for electrically shorting said terminal pins together and automatically compensating for terminal pin misalignment, and
means positioned in said receiving means and having
  an operating lever rotatably operatable for engaging and disengaging said cantilever spring members with said pair of terminal pins.

2. The terminal pin shorting apparatus set forth in claim 1 wherein said receiving means comprises
a pair of housing components formed of electrically insulating material with one of said housing components having a chamber for slidably receiving said pair of terminal pins and configured for holding said electrical shorting and compensating means with each cantilever spring member normally in engagement with one of said terminal pins and with said other housing component having a channel for supporting said engaging and disengaging means and a slot formed at a right angle to said channel for receiving said operating lever.

3. The terminal pin shorting apparatus set forth in claim 2 wherein said electrical shorting and compensating means comprises
helical spring means integrally interconnected by said common member and extended into said cantilever spring members for normally engaging and compensating for misalignment of the terminal pins.

4. The terminal pin shorting apparatus set forth in claim 3 wherein said engaging and disengaging means comprises
a member pivotally mounted in said other housing component channel, and
a lever member mounted on said pivotal member and positioned in said other housing component slot with a cam section at one end thereof for disengaging both cantilever spring members from said pair of terminal pins.

5. Apparatus for shorting terminal pins comprising
an insulating housing member having a chamber therein for receiving a pair of the terminal pins,
an electrical shorting member positioned in said housing member chamber and having a common member interconnecting a pair of cantilever spring members integral with said common member and each formed across the other for engaging said pair of terminal pins and automatically compensating for terminal pin misalignment, and
an actuating member positioned in said housing member chamber with an operating lever extending outward from said housing member between said pair of terminal pins and rotatably operatable by said lever for engaging and disengaging said cantilever spring members from said pair of terminal pins.

6. The terminal pin shorting apparatus set forth in claim 5 wherein said insulating housing member comprises
first and second components formed of electrically insulating material with said first housing component having a chamber with a pair of apertures for receiving said pair of terminal pins and configured for holding said electrical shorting member with each said cantilever spring member normally in engagement with one of said pair of terminal pins and with said second housing component having a channel for supporting said actuating member and having generally cross configured slots with a first slot for receiving said pair of terminal pins extended through said housing member and a second slot formed at right angles to said channel for receiving said actuating member operating lever.

7. The terminal pin shorting apparatus set forth in claim 6 wherein said electrical shorting member comprises
a pair of helical springs interconnected by said common member and each extended into one of said cantilever spring members for compensating for misalignment of ones of said pair of terminal pins.

8. The terminal pin shorting apparatus set forth in claim 7 wherein said actuating member comprises
a member pivotally mounted in said second housing component channel parallel to said pair of terminal pins, and
a lever member mounted on said pivotal member and positioned in said second slot to extend outward therefrom between said pair of terminal pins with a cam surface at one end for disengaging both cantilever spring members from said pair of terminal pins as said lever member is rotated about an axis of said pivotal member.

9. Switch apparatus for shorting terminal pins of equipment mounting apparatus backplanes comprising a first housing component formed of electrical insulating material having a chamber with a pair of apertures opening on the bottom surface thereof for slidably receiving a pair of the terminal pins and having a pair of pins extending from said bottom surface for securing said first housing component to one of the backplanes, a second housing component formed of electrical insulating material and secured to said first housing component with a channel formed parallel to said pair of first housing component apertures and having generally cross configured slots with one slot formed at right angles to said channel and the other slot formed for slidably receiving said pair of terminal pins with said pair of terminal pins extending vertically from said upper surface thereof, an electrical shorting member positioned in said first housing component chamber and having a pair of helical springs each integral with and interconnected by a common member with each helical spring extended into a cantilever spring formed across the other cantilever spring for engaging one of the terminal pins and compensating for terminal pin misalignment, and an actuating member having a member pivotally mounted in said second housing component channel and a lever member positioned in said second housing component one slot with a cam surface formed at one end and positioned between said crossed cantilever springs for engaging and disengaging said cantilever springs with said pair of terminal pins as said lever member is rotated about an axis of said pivotal member as connector apparatus is engaged and disengaged with the backplane terminal pins.

10. Apparatus (1) for use with equipment mounting backplane terminal pins comprising means for electrically shorting ones of the terminal pins together characterized in that said electrical shorting means comprises an insulated housing member (10) having a chamber therein with apertures formed for slidably receiving a pair of the terminal pins, an electrical shorting member (12,13) positioned in said insulated housing member chamber and formed with a common member (120,130) interconnecting a pair of helical springs (121,122,131,132) each extended into an independent cantilever spring (123,124,133,134) formed across the other independent cantilever spring for normally engaging one of the terminal pins and compensating for terminal pin misalignment, and an actuating member (11) rotatably positioned in said insulating housing member and having a lever member (110) extending outward at an angle from an upper surface of said insulating housing with a cam surface (1101) positioned between said crossed independent cantilever springs for disengaging said independent cantilever springs from said pair of terminal pins in response to rotation of said actuating member occasioned by engagement of connector apparatus with the pair of backplane terminal pins.

* * * * *